United States Patent [19]
Ishikawa et al.

[11] Patent Number: 5,486,796
[45] Date of Patent: Jan. 23, 1996

[54] OSCILLATOR CIRCUIT FOR RECEIVING A WIDE FREQUENCY BAND SIGNAL

[75] Inventors: Nobuyuki Ishikawa, Kanagawa; Tadashi Imai, Saitama, both of Japan

[73] Assignee: Sony Corporation, Tokyo, Japan

[21] Appl. No.: 354,836

[22] Filed: Dec. 8, 1994

[30] Foreign Application Priority Data

Dec. 20, 1993 [JP] Japan ................................. 5-320252

[51] Int. Cl.$^6$ ............................... H03B 5/12; H03D 3/00; H03L 7/099
[52] U.S. Cl. ............................ 331/117 R; 331/8; 331/23; 331/36 C; 331/177 V; 329/326; 348/735; 455/262
[58] Field of Search ............................ 331/36 C, 117 R, 331/117 FE, 177 V, 8, 17, 20, 23; 329/318, 325, 326; 348/726, 735, 910; 455/208, 262–265, 337

[56] References Cited

FOREIGN PATENT DOCUMENTS

| | | |
|---|---|---|
| 0227402 | 7/1987 | European Pat. Off. . |
| 0351153 | 1/1990 | European Pat. Off. . |
| 2815570 | 10/1979 | Germany . |

OTHER PUBLICATIONS

Dekker, A.; "Universal Voltage–Controlled Oscillator With Low Phase Noise"; *Electronics & Wireless World*; vol. 93; No. 1617; Jul. 87; pp. 707–709; 331–177V.

*Primary Examiner*—David Mis
*Attorney, Agent, or Firm*—Ronald P. Kananen

[57] ABSTRACT

An oscillator provided with an oscillation circuit provided with two oscillation transistors comprising a differential pair and a resonance circuit connected in common to the bases of the oscillation transistors. The bases of the oscillation transistors are short-circuited by a coil, a center tap coil is connected in parallel to the resonance circuit, and variable capacitive diodes in the resonance circuit are driven by a coil connected to a mixing circuit. Due to this, it is possible to prevent the occurrence of low frequency noise, possible to realize a completely balanced operation, possible to avoid the oscillation carrier flowing into the power source and ground, and possible to reduce the noise in a television picture.

13 Claims, 4 Drawing Sheets

OSCILLATOR CIRCUIT FOR RECEIVING A WIDE FREQUENCY BAND SIGNAL

BACKGROUND OF THE INVENTION

1. Field of the Invention

The present invention relates to an oscillator used for a television tuner etc. for receiving a wide frequency band signal.

2. Description of the Related Art

FIG. 1 is a circuit diagram showing the basic configuration of this type of oscillator as a related art.

In FIG. 1, OSC represents an oscillation circuit, RSN a resonance circuit, MIX a mixing circuit, and $AMP_{DC}$ a DC amplifier.

The oscillation circuit OSC is integrated and is comprised of npn type transistors $Q_1$ and $Q_2$ comprising a differential type Colpitz oscillation circuit, npn type transistors $Q_3$ and $Q_4$ comprising a differential output stage, a biasing constant voltage source $V_1$ of the oscillation npn type transistors $Q_1$ and $Q_2$, resistance elements $R_1$ to $R_4$, and constant current sources $I_1$ to $I_3$.

The base of the oscillation transistor $Q_1$ is connected to an input/output terminal $T_1$, is connected through the resistance element $R_1$ to a line of a constant voltage source $V_1$, and is connected through the resistance element $R_3$ to the base of the transistor $Q_3$. The emitter of the oscillation transistor $Q_1$ is connected to an input/output terminal $T_2$ and is connected to the constant current source $I_1$, which constant current source $I_1$ is grounded. The collector of the oscillation transistor $Q_1$ is connected to a line of a power source voltage $V_{cc}$.

The base of the oscillation transistor $Q_2$ is connected to an input/output terminal $T_4$, is connected through the resistance element $R_2$ to the line of the constant voltage source $V_1$, and is connected through the resistance element $R_4$ to the base of the transistor $Q_4$. The emitter of the oscillation transistor $Q_2$ is connected to an input/output terminal $T_3$ and is connected to the constant current source $I_3$, which constant current source $I_2$ is grounded. The collector of the oscillation transistor $Q_2$ is connected to the line of the power source voltage $V_{cc}$.

The transistors $Q_3$ and $Q_4$ are connected at their emitters and a node of the two is connected to the constant current source $I_3$. The constant current source is grounded. The collectors of the transistors $Q_3$ and $Q_4$ are connected to the input of the mixing circuit MIX.

Further, the output terminal of the mixing circuit MIX is connected through the load resistance elements $R_5$ and $R_6$ to the line of the power source voltage $V_{cc}$ and is connected to the input of the DC amplifier $AMP_{DC}$.

The resonance circuit RSN is comprised of a series circuit of a variable capacitive diode $VC_1$ and coil $L_1$ to which are connected in parallel the capacitors $C_1$ and $C_2$.

The node between one end of the coil $L_1$ of the resonance circuit RSN and the capacitors $C_1$ and $C_2$ is grounded through the resistance element $R_7$ of the resistance value of 30 kΩ and is connected to the input/output terminal $T_1$ (base of oscillation transistor $Q_1$) through the DC cutting capacitor $C_3$.

The node between the cathode of the variable capacity diode $VC_1$ and the capacitors $C_1$ and $C_2$ is connected to the output of the DC amplifier $AMP_{DC}$ through a drive resistance element $R_8$ of a resistance value of 30 kΩ and is connected to an input/output terminal $T_4$ (base of oscillation transistor $Q_2$) through a DC cutting capacitor $C_3$.

Between the node of the capacitor $C_3$ and the input/output terminal $T_1$ and the input/output terminal $T_2$ is connected a positive feedback capacitor $C_5$ and between the node of the capacitor $C_4$ and the input/output terminal $T_4$ is connected a positive feedback capacitor $C_6$.

Further, between the node of the capacitor $C_5$ and the input/output terminal $T_2$ and the node of the capacitor $C_6$ and the input/output terminal $T_3$ (between the emitter of the oscillation transistor $Q_1$ and the emitter of the oscillation transistor $Q_2$) is connected a coupling capacitor $C_7$.

Note that the capacities of the externally provided capacitors $C_1$ to $C_7$ are set for example as follows: 1 pF for the capacitor $C_1$, 13 pF for the capacitor $C_2$, 56 pF for the capacitors $C_3$ and $C_4$, 2 pF for the capacitors $C_5$ and $C_6$ and 3 pF for the capacitor $C_7$.

In such a configuration, the oscillation circuit OSC receives positive feedback from the capacitors $C_5$ and $C_6$ connected between the bases and emitters of the oscillation transistors $Q_1$ and $Q_2$ through the input/output terminals $T_1$, $T_2$, $T_3$, and $T_4$, oscillates at the resonance frequency of the resonance circuit RSN connected to the bases of the oscillation transistors $Q_1$ and $Q_2$, and outputs the local oscillation frequency signal $S_L$ of a predetermined frequency through the transistors $Q_3$ and $Q_4$ to the mixing circuit MIX.

Note that the oscillation transistors $Q_1$ and $Q_2$ comprising the differential Colpitz oscillation circuit are connected at their bases through the resonance circuit RSN, so perform oscillation operations with opposite phases.

Accordingly, local oscillation frequency signals $S_L$ with opposite phases are output from the collectors of the transistors $Q_3$ and $Q_4$.

In the mixing circuit MIX, the FM modulated video signal of the selected channel and the local oscillation frequency signal $S_L$ are mixed, and the signal of the frequency of the difference is taken out and is output to the DC amplifier $AMP_{DC}$. Further, the resonance circuit RSNa is driven through the coil $L_4$ by the output of the DC amplifier $AMP_{DC}$.

That is, after the phase detection by the mixing circuit MIX, the control voltage of the demodulation frequency, which is based on the drive resistance element $R_8$ and the output of the DC amplifier $AMP_{DC}$, is supplied to the cathode of the variable capacity diode $VC_1$ of the resonance circuit RSN.

However, the above-mentioned circuit is used as an oscillator for an FM demodulator for satellite broadcasting (BS) and the frequency is 400 MHz to 500 MHz.

However, in the above-mentioned circuit, it suffers from the disadvantage that it is not possible to obtain a satisfactory picture since noise of a low frequency band would occur, which could be readily discerned even by the human eye, in the television picture, due to the so-called shot noise, flicker noise, or burst noise arising from the construction of the junction portion of the oscillation transistors $Q_1$ and $Q_2$ itself and the lattice faults, hot noise due to the resistance elements $R_1$ and $R_2$, etc.

Further, the control voltage of the demodulation frequency based on the output of the drive resistance element $R_8$ and the DC amplifier $AMP_{DC}$ is supplied to the cathode of the variable capacity diode $VC_1$ of the resonance circuit RSN, but the resistance value of the drive resistance element $R_8$ is, as explained above, 30 kΩ, the time constant with the capacitors is large, the drive impedance of the variable capacity diode $VC_1$ is high, the frequency characteristics will not improved, and therefore this becomes a cause behind low frequency noise.

Since the operational frequency is a high of about 400 MHz to 500 MHz or so, the oscillation carrier easily flows into the power source and ground and therefore it suffers from the disadvantage that there is a liability of occurrence of a pseudo lock and a beat by the high frequency component.

SUMMARY OF THE INVENTION

The present invention was made in consideration of these circumstances and has as its object to provide an oscillator which reduces noise, operates stably without the oscillation carrier flowing to a power source or ground, can prevent the occurrence of a pseudo lock and high frequency beat even at a weak electric field, and therefore can improve the quality of a television picture.

According to the present invention, there is provided an oscillator comprising: a differential type amplifier formed by first and second transistors; a resonance circuit, output terminals thereof is connected to bases of the first and second transistors; and a first inductive element connected between the bases of the first and second transistors.

According to the present invention, the bases of the first and second transistors are connected by the first inductive element, so the impedance across the bases becomes low at the time of the oscillation operation and therefore the so-called shot noise, flicker noise, burst noise, etc. arising due to the construction of the junction portion of the first and second transistors themselves or lattice faults are canceled out and the occurrence of low frequency noise at the television picture can be suppressed.

Preferably, the oscillator further includes a second inductive element connected to the resonance circuit in parallel, a point divided inductance thereof into substantially equal two values is grounded.

According to the present invention, the oscillation circuit becomes one of a completely balanced configuration due to the second inductive element. Accordingly, a stable oscillation operation is achieved without the oscillation carrier flowing into the power source or ground, whereby the occurrence of a pseudo lock or a high frequency beat can be prevented even with a weak electric field.

Also, preferably, the oscillator further includes a mixing circuit having input terminals connected to output terminals of the amplifier, and a third inductance element connected between an output terminal of the mixing circuit and a frequency control terminal of the resonance circuit.

The resonance circuit is driven by a signal which is phase-detected in response to an output signal of the amplifier in the mixing circuit and is applied to the frequency control terminal through the third inductive element.

According to the present invention, the resonance circuit is driven by a low impedance through the third inductive element at a demodulation frequency. Due to this, the frequency characteristics are improved and the occurrence of low frequency noise is suppressed.

Preferably, the resonance circuit includes at least first and second variable capacitive elements oppositely connected in series. The frequency control terminal is provided at a point commonly connected the variable capacitive elements, to vary the capacitances of the first and second variable capacitive elements in response to a signal from the second inductive element.

Also, preferably, the oscillator further includes a first capacitive element connected between the base and emitter of the first transistor of the amplifier, a second capacitive element connected between the base and emitter of the second transistor of the amplifier, and a third capacitive element connected between the emitters of the first and second transistors.

As the base and emitter of the first transistor are connected by the first capacitive element, the emitter of the first transistor and the ground are connected by the second capacitive element, the base of the second transistor and the ground are connected by the third capacitive element, and the collector of the first transistor is connected to the ground, the impedance of the second capacitive element and the first inductive element itself can contribute to the oscillation. Further, the grounding points become the third capacitive element and the collector of the first transistor, so there is no effect from the unbalance of the differential pair due to variations in the elements or external noise, and the oscillation operation is controlled by just the peripheral elements of the first transistor at all times.

Alternatively, the oscillator further includes a first capacitive element connected between the base and emitter of the first transistor, a second capacitance element connected between the emitter of the first transistor and ground, and a third capacitive element connected between the base of the second transistor and ground. A collector of the first transistor is connected to ground.

Preferably, the first inductance element has a point where inductance thereof is divided into substantially equal two values and is connected to ground.

BRIEF DESCRIPTION OF THE DRAWINGS

These and other objects and features of the present invention will become clearer from the following description of preferred embodiments with reference to the accompanying drawings, in which.

DESCRIPTION OF THE PREFERRED EMBODIMENTS

Preferred embodiments of the present invention will be described.

First Embodiment

Figure 1:
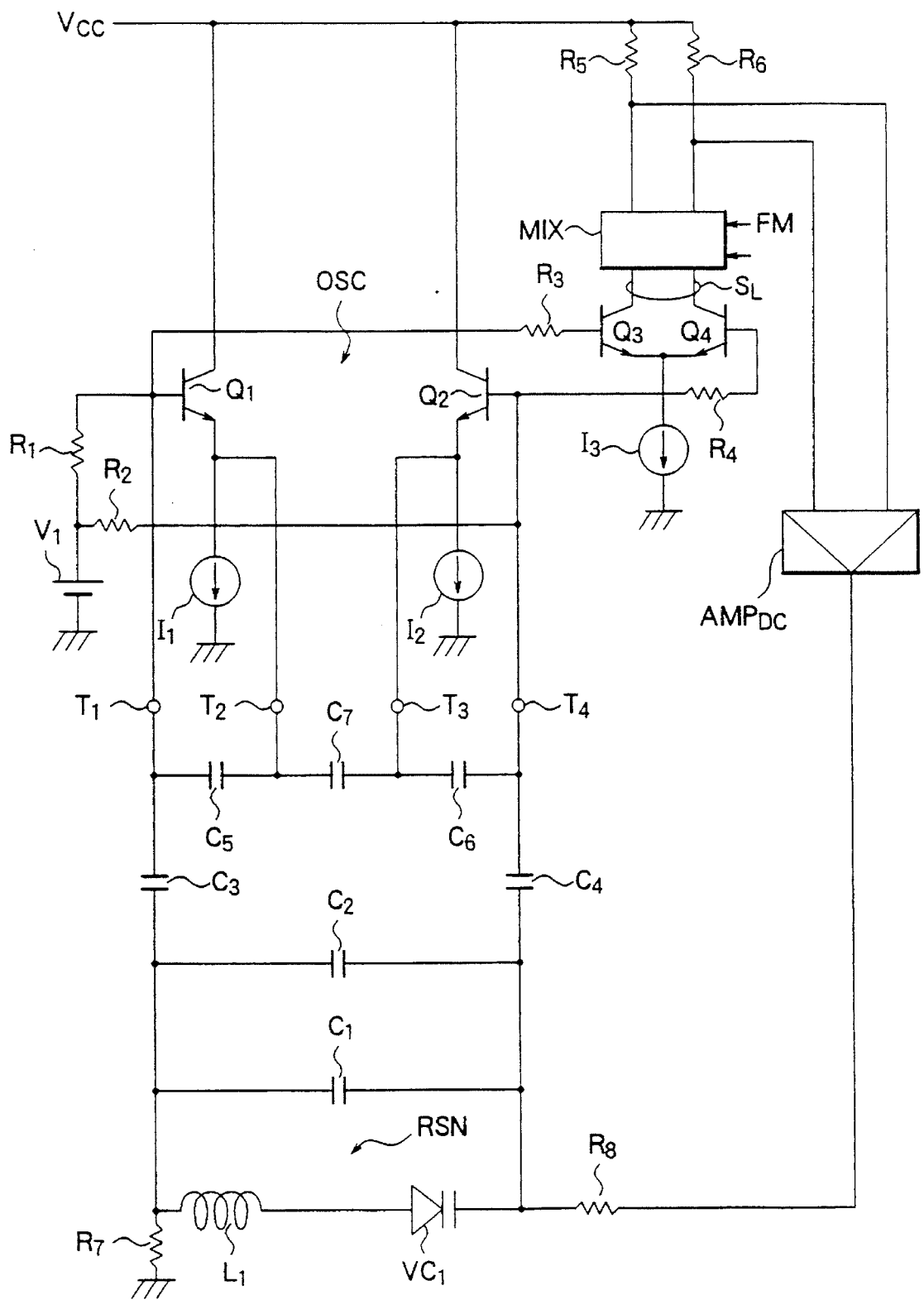
FIG. 1 is a circuit diagram showing an example of the configuration of an oscillator of the related art.
Figure 2:
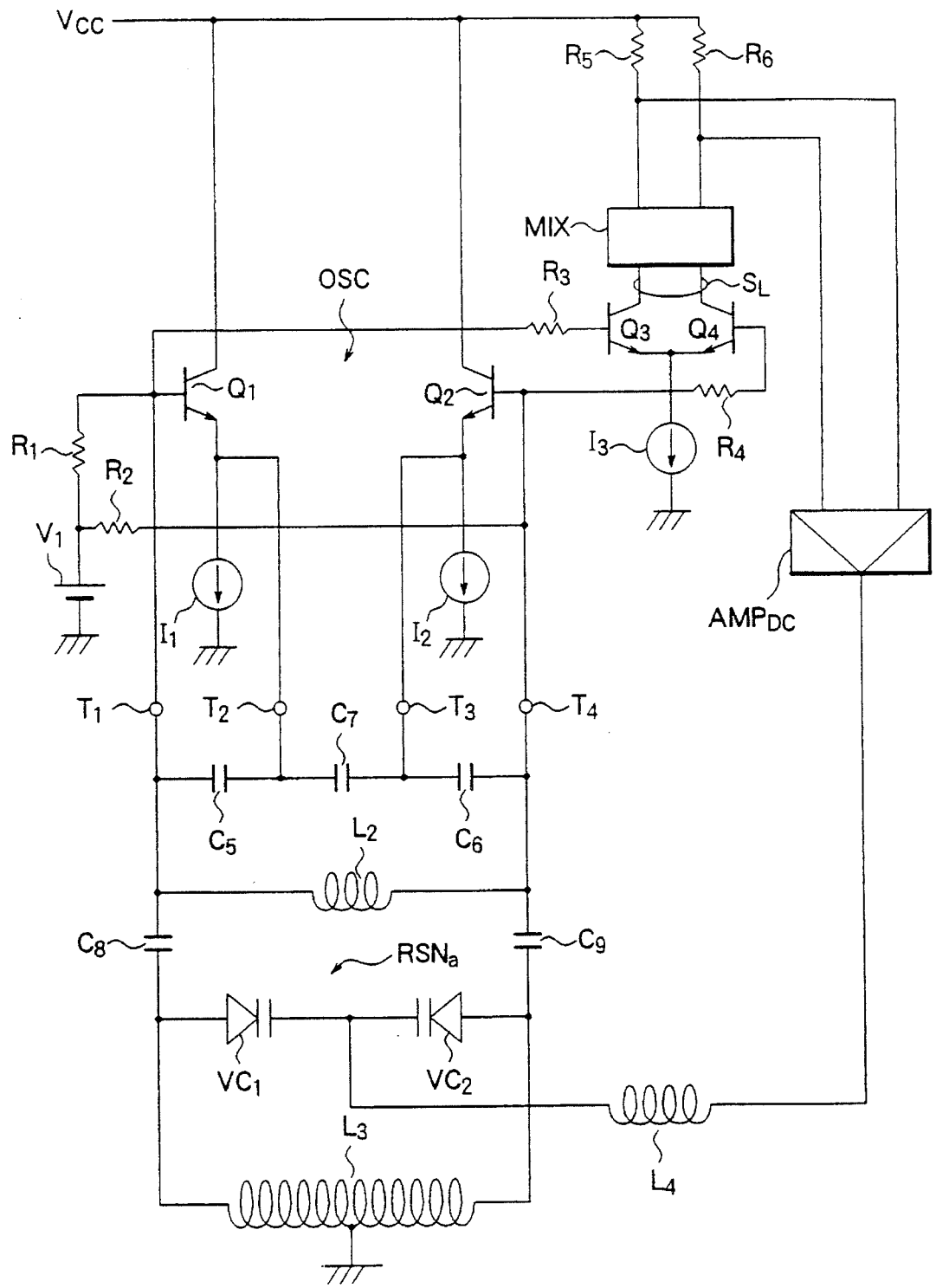
FIG. 2 is a circuit diagram showing a first embodiment of the oscillator according to the present invention.

FIG. 2 is a circuit diagram showing a first embodiment of an oscillator according to the present invention, wherein components the same as those in FIG. 1 showing the related art are shown with the same references.

That is, OSC is an oscillation circuit, RSNa a resonance circuit, MIX a mixing circuit, $AMP_{DC}$ a DC amplifier, $L_2$ an oscillation coil, $L_3$ a center tap coil, $L_4$ a drive/high frequency signal blocking coil, $C_5$ and $C_5$ positive feedback capacitors, and $C_7$ a coupling capacitor.

This circuit may be preferably used as an oscillator for an FM demodulator for satellite broadcasting (BS) and operates at a frequency of about 400 MHz to 500 MHz.

The oscillation circuit OSC is integrated and is comprised of npn type transistors $Q_1$ and $Q_2$ comprising a differential type Colpitz oscillation circuit, npn type transistors $Q_3$ and $Q_4$ comprising a differential output stage, a biasing constant voltage source $V_1$ of the oscillation npn type transistors $Q_1$ and $Q_2$, resistance elements $R_1$ to $R_4$, and constant current sources $I_1$ to $I_3$.

The base of the oscillation transistor $Q_1$ is connected to the input/output terminal $T_1$, is connected through the resistance element $R_1$ to the constant voltage source $V_1$, and is connected through the resistance element $R_3$ to the base of the transistor $Q_3$. The emitter of the oscillation transistor $Q_1$ is connected to the input/output terminal $T_2$ and is connected to the constant current source $I_1$, which constant current source $I_1$ is grounded. The collector of the oscillation transistor $Q_2$ is connected to the line of the power source voltage $V_{cc}$.

The base of the oscillation transistor $Q_2$ is connected to the input/output terminal $T_4$, is connected through the resistance element $R_2$ to the constant voltage source $V_1$, and is connected through the resistance element $R_4$ to the base of the transistor $Q_4$. The emitter of the oscillation transistor $Q_2$ is connected to the input/output terminal $T_3$ and is connected to the constant current source $I_2$. The constant current source $I_2$ is grounded. The collector of the oscillation transistor $Q_2$ is connected to the line of the power source voltage $V_{cc}$.

Further, the transistors $Q_3$ and $Q_4$ are connected at their emitters, the node between the two is connected to the constant current source $I_3$, and the constant current source $I_3$ is grounded. Further, the collectors of the transistors $Q_3$ and $Q_4$ are connected to the input of the mixing circuit MIX.

Further, the output terminal of the mixing circuit MIX is connected through the load resistance elements $R_5$ and $R_6$ to the line of the power source voltage $V_{cc}$ and connected to the input of the DC amplifier $AMP_{DC}$.

The resonance circuit RSNa is comprised primarily of the two variable capacity diodes $VC_1$ and $VC_2$ with cathodes connected. The oscillation coil $L_2$ and the center tap coil $L_3$ are connected in parallel to these variable capacity diodes $VC_1$ and $VC_2$, while the drive/high frequency signal blocking coil $L_4$ is connected between the node between the cathodes of the two variable capacity diodes $VC_1$ and $VC_2$ and the output of the DC amplifier $AMP_{DC}$.

As the oscillation coil $L_2$, use is made of a coil comprised of for example 2 to 4 turns (T) and of about 20 Ω at a frequency of 400 MHz. One end of the oscillation coil $L_2$ is connected to the node of the input/output terminal $T_1$ and the positive feedback capacitor $C_5$, while the other end is connected to the node between the input/output terminal $T_4$ and the positive feedback capacitor $C_6$. That is, due to the oscillation coil $L_2$, the bases of the oscillation transistors $Q_1$ and $Q_2$ are connected by a low impedance. Further, the oscillation frequency is determined based on the oscillation coil $L_2$ and the variable capacity diodes $VC_1$ and $VC_2$. The oscillation frequency f is given by the following formula:

$$f=1/\{2R(L \cdot CD/2)^{1/2}\} \tag{1}$$

The capacities of the variable capacity diodes $VC_1$ and $VC_2$ are set to about 10 to 20 pF each. The anode of the variable capacity diode $VC_1$ is connected through the coupling capacitor $C_8$ to the node between one end of the oscillation coil $L_2$ and the positive feedback capacitor $C_5$.

The anode of the variable capacity diode $VC_2$ is connected through the coupling capacitor $C_9$ to the node between the other end of the oscillation coil $L_2$ and the positive feedback capacitor $C_6$.

The capacities of the coupling capacitors $C_8$ and $C_9$ are set to for example 30 to 50 pF.

The center tap coil $L_3$ used is a coil comprised of for example 10 T and of about 200 Ω at a frequency of 400 MHz. That is, $L_3 \gg L_2$.

One end of the center tap coil $L_3$ is connected to the anode of the variable capacity diode $VC_1$, while the other end is connected to the anode of the variable capacity diode $VC_2$. Further, the center point (tap) is grounded. Due to this, the variable capacity diodes $VC_1$ and $VC_2$ are held at the ground potential.

Note that the impedance of the center tap coil $L_3$ is sufficiently high with respect to the oscillation frequency f, so there is no need for the center tap to be positioned strictly at the center point of the coil and may be suitably positioned.

Further, as the center tap coil $L_3$, instead of grounding the center point of one coil, it is also possible to connect two coils of the same number of turns in series and ground the node of the same.

The drive/high frequency signal blocking coil $L_4$ used is a coil which is for example comprised of 15 T and has a high impedance at the oscillation frequency and a low impedance, for example, several tens of ohms, at the demodulation frequency. Further, at the low frequency, for example, less than 100 kHz, it is held to less than 0.063 Ω.

The drive/high frequency signal blocking coil $L_4$ is connected to the node of the cathodes of the variable capacity diodes $VC_1$ and $VC_2$ at one end and is connected to the output of the DC amplifier $AMP_{DC}$ at the other end.

Next, an explanation will be made of the operation according to the above configuration.

The oscillation circuit OSC functions as a so-called completely balanced type Colpitz oscillation circuit since the center point of the externally provided center tap coil $L_3$ is grounded.

Such a completely balanced type oscillation circuit OSC receives, in the inductive region of the so-called parallel tank circuit between the oscillation coil $L_2$ and the variable capacity diodes $VC_1$ and $VC_2$, positive feedback by the capacitors $C_5$ and $C_6$ connected between the bases and emitters of the oscillation transistors $Q_1$ and $Q_2$ through the input/output terminals $T_1$ and $T_2$, oscillates at the resonance frequency, and outputs the local oscillation frequency signal $S_L$ of the predetermined frequency to the mixing circuit MIX through the transistors $Q_3$ and $Q_4$.

Note that the oscillation transistors $Q_1$ and $Q_2$ comprising the differential Colpitz oscillation circuit are connected at their bases through the resonance circuit RSNa, so perform oscillation operations of different phases from each other.

Accordingly, local oscillation frequency signals $S_L$ of opposite phases are output from the collectors of the transistors $Q_3$ and $Q_4$.

At this time, the bases of the oscillation transistors $Q_1$ and $Q_2$ are connected by the coil $L_2$ of the low impedance near the oscillation frequency, so the so-called shot noise, flicker noise, burst noise, etc. arising due to the construction of the junction portion of the first and second transistors $Q_1$ and $Q_2$ themselves, the hot noise due to the resistance elements $R_1$ and $R_2$, etc. are canceled out and the occurrence of low frequency noise at the television picture can be suppressed.

In the mixing circuit MIX, the FM modulated video signal of the selected channel and the local oscillation frequency signal $S_L$ are mixed, and the signal of the frequency of the difference is taken out and is output to the DC amplifier $AMP_{DC}$. Further, the resonance circuit RSNa is driven through the coil $L_4$ by the output of the DC amplifier $AMP_{DC}$.

That is, after phase detection at the mixing circuit MIX, the control voltage of the demodulation frequency, which is based on the output of the coil $L_4$ and the DC amplifier $AMP_{DC}$, is supplied to the cathode of the variable capacity diodes $VC_1$ and $VC_2$ of the resonance circuit RSNa. The oscillation circuit OSC finally oscillates locked to a frequency according to the control voltage.

At this time, the coil $L_4$ is of a high impedance at the oscillation frequency, but is a low impedance, for example, several tens of ohms, at the demodulation frequency, so the frequency characteristics improved and the occurrence of low frequency noise can be suppressed.

Further, since the oscillation circuit is configured for a complete balance, despite the fact the operational frequency is a high 400 MHz to 500 MHz, it is possible to suppress the flow of oscillation carrier into the power source and ground and therefore the occurrence of a pseudo lock or a beat due to the high frequency component can be prevented.

As explained above, according to the present invention, the bases of the oscillation transistors $Q_1$ and $Q_2$ are connected by the low impedance coil $L_2$, so the flicker and low frequency noise impedance becomes close to zero and as a result the noise in the television picture can be reduced.

Further, since the center tap coil $L_3$ is provided, a completely balanced operation can be realized in the oscillation circuit. As a result, stable operation can be realized without the oscillation carrier flowing into the power source and the ground. Further, occurrence of a pseudo lock and high frequency beat can be prevented even in a weak electric field.

In addition, since the variable capacity diodes $VC_1$ and $VC_2$ are driven by the coil $L_4$, the impedance of the flicker noise region can be kept low and it is possible to suppress low frequency noise.

Second Embodiment

Figure 3:
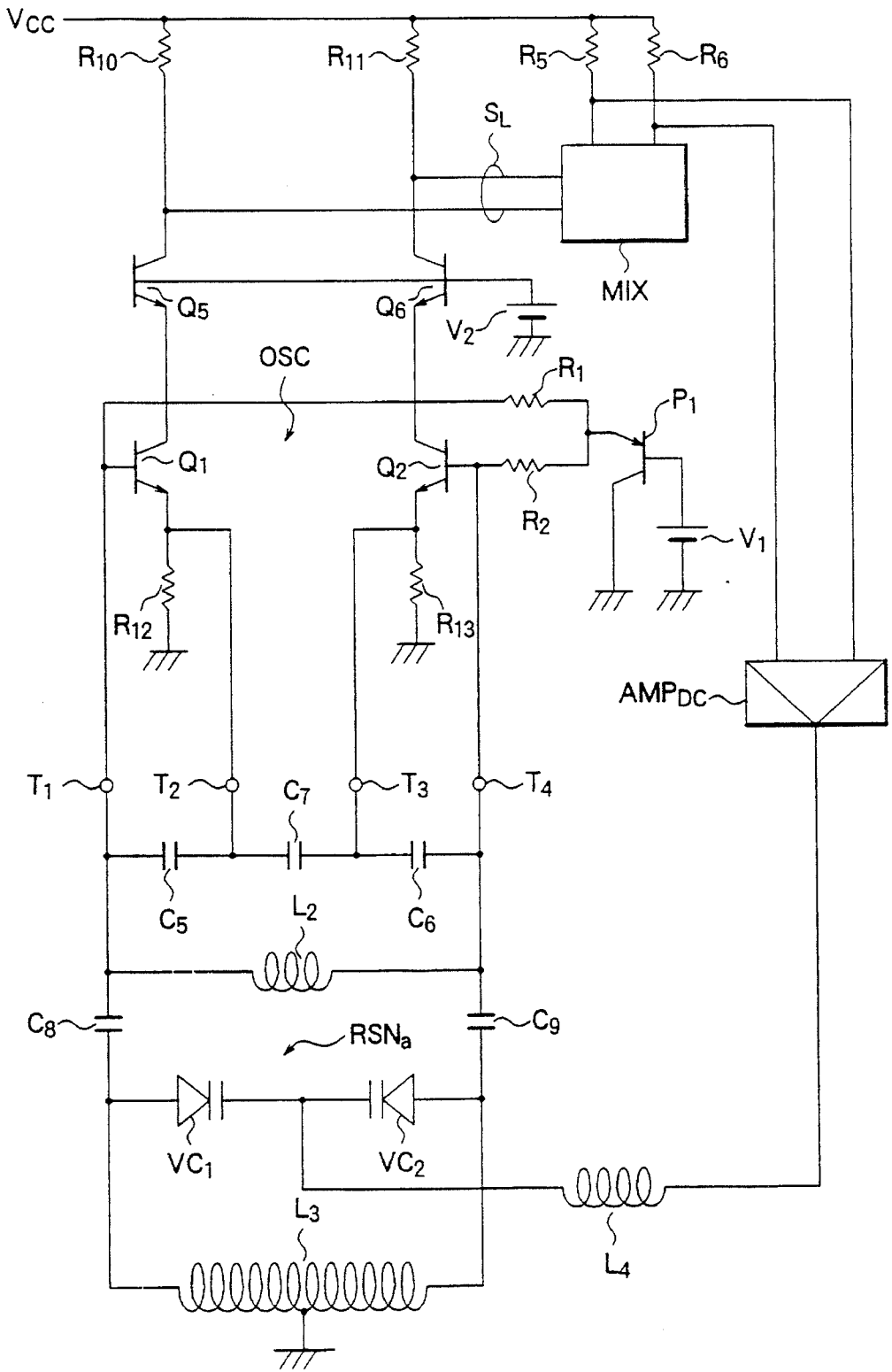
FIG. 3 is a circuit diagram showing a second embodiment of an oscillator according to the present invention.

FIG. 3 is a circuit diagram showing a second embodiment of the oscillator according to the present invention.

The point of difference between the second embodiment and the first embodiment is that instead of the local oscillation frequency signal $S_L$ of the oscillation circuit OSC being output through the npn type transistors $Q_3$ and $Q_4$, connected in parallel to the oscillation transistors $Q_1$ and $Q_2$, from these transistors $Q_3$ and $Q_4$, the npn type transistors $Q_5$ and $Q_6$ are connected in series between the oscillation transistors $Q_1$ and $Q_2$ and the load resistance elements $R_{10}$ and $R_{11}$ connected to the power source voltage $V_{cc}$ and the local oscillation frequency signal $S_L$ is output from the nodes between the collectors of the npn type transistors $Q_5$ and $Q_6$ and the load resistance elements $R_{10}$ and $R_{11}$.

Further, between the emitters of the oscillation transistors $Q_1$ and $Q_2$ and the ground are connected the resistance elements $R_{12}$ and $R_{13}$ functioning as current sources.

The emitter of the transistor $Q_5$ is connected to the collector of the oscillation transistor $Q_1$, the emitter of the transistor $Q_6$ is connected to the collector of the oscillation transistor $Q_2$, and the bases of the two transistors $Q_5$ and $Q_6$ are connected to the constant voltage source $V_2$.

Further, the constant voltage source $V_1$ is connected to the base of the pnp type transistor $P_1$, the emitter of the pnp type transistor $P_1$ is connected to the node of the resistance elements $R_1$ and $R_2$, and the collector is grounded.

In this configuration as well, a similar operation is performed as in the first embodiment explained above. A similar effect to the effect of the first embodiment explained above is obtained, of course, and there are the advantages that the current consumption can be reduced and the isolation with the mixing circuit MIX can be improved.

Third Embodiment

Figure 4:
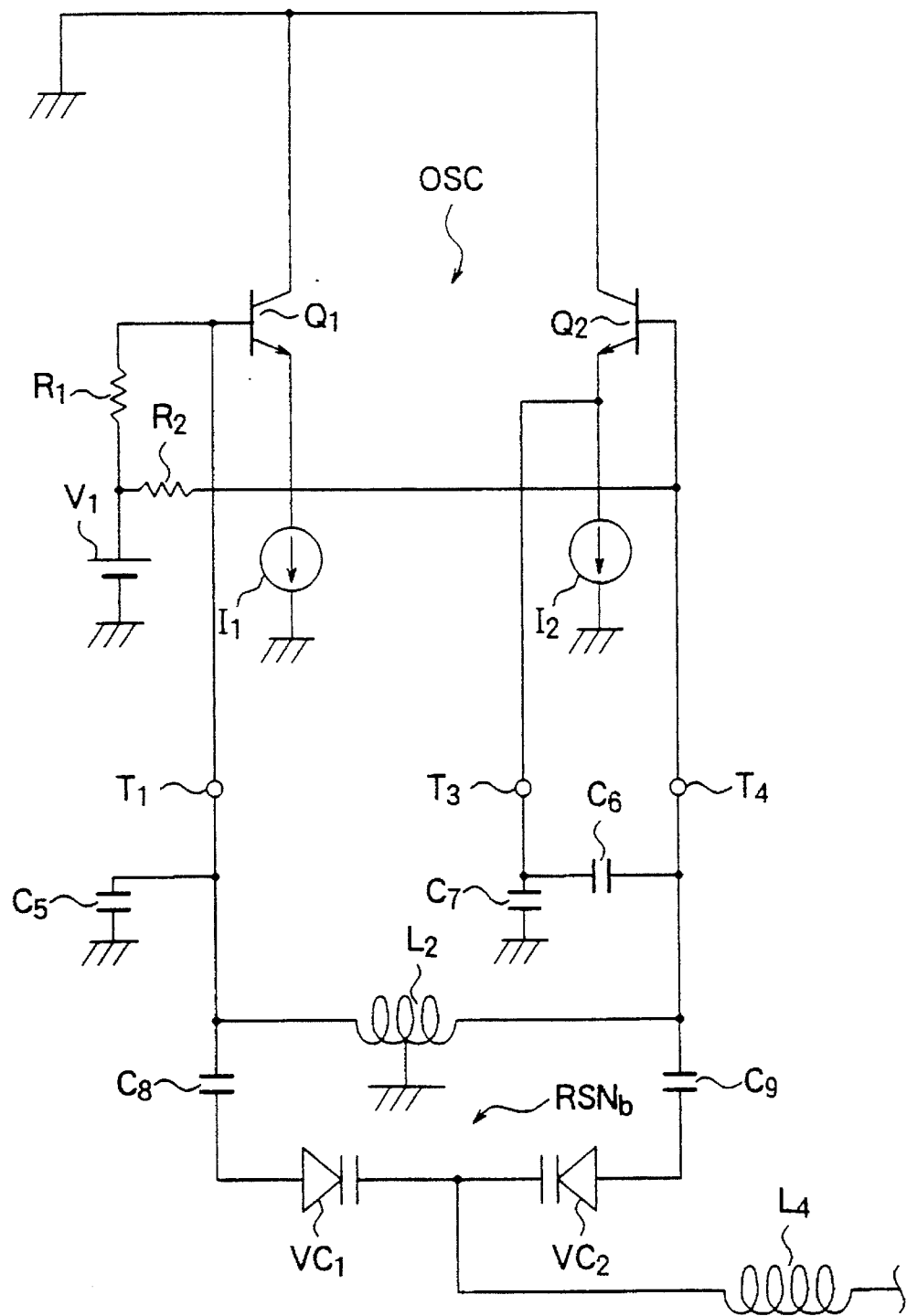
FIG. 4 is a circuit diagram showing a third embodiment of an oscillator according to the present invention.

FIG. 4 is a circuit diagram of key parts showing a third embodiment of the oscillator according to the present invention.

The oscillation circuit according to this embodiment differs from the first embodiment and the second embodiment in that the transistors $Q_1$ and $Q_2$ comprising the differential pair are not balanced and the oscillator is configured using just the transistor $Q_2$.

Therefore, an externally provided capacitor $C_5$ is connected between the input/output terminal $T_1$ and the ground, a capacitor C7 is connected between the input/output terminal $T_3$ and the ground, and the collectors of the transistors $Q_1$ and $Q_2$ are grounded.

Further, instead of using the center tap coil $L_3$, the center point of the oscillation coil $L_2$ is grounded.

In such a configuration, the capacitor C7 and the coil $L_2$ contribute to the impedance of the element itself.

Further, the grounding points become one of the electrodes of the capacitor $C_5$ and the collector of the transistor $Q_1$, there is no effect from the imbalance of the differential pair due to variations in the elements or external noise, and the oscillation is controlled at all times by the peripheral elements of the transistor $Q_2$.

Note that in this embodiment too, like with the first embodiment explained above, the bases of the oscillation transistors $Q_1$ and $Q_2$ are connected by the coil $L_2$, so the flicker and low frequency noise impedance becomes close to zero and as a result the noise of the television picture can be reduced. Further, since the variable capacity diodes $VC_1$ and $VC_2$ are driven by the coil $L_4$, the impedance of the flicker noise region can be kept low and it is possible to suppress low frequency noise.

As explained above, according to the present invention, the flicker and the low frequency noise impedance become close to zero and as a result the noise in a television picture can be reduced.

Further, since a so-called center tap inductive element is provided, the oscillation carrier will not flow into the power source and ground and therefore a stable oscillation operation can be realized and it is possible to prevent occurrence of a pseudo lock and high frequency beat even in a weak electric field.

What is claimed is:

1. An oscillator comprising:

a differential type amplifier formed by first and second transistors;

a resonance circuit, output terminals thereof being connected to bases of said first and second transistors;

a first inductive element directly connected between said bases of said first and second transistors; and a second inductive element connected to said resonance circuit in parallel, a point dividing inductance thereof into substantially two equal values being grounded.

2. An oscillator as set forth in claim 1, further comprising a mixing circuit having input terminals connected to output terminals of said differential type amplifier, and a third inductance element connected between an output terminal of said mixing circuit and a frequency control terminal of said resonance circuit, wherein said resonance circuit is driven by a signal which is phase-detected in response to an output signal of said amplifier in said mixing circuit and is applied to said frequency control terminal through said third inductive element.

3. An oscillator as set forth in claim 2, wherein a frequency control section is connected to said second inductive element in parallel.

4. An oscillator as set forth in claim 2, wherein said resonance circuit comprises at least first and second variable capacitive elements oppositely connected in series, and wherein said frequency control terminal is provided at a point commonly connecting said variable capacitive elements, to vary the capacitances of said first and second variable capacitive elements in response to a signal from said second inductive element.

5. An oscillator as set forth in claim 1, further comprising a first capacitive element connected between a base and an emitter of said first transistor of said differential type amplifier, a second capacitive element connected between said base and emitter of said second transistor of said differential type amplifier; and a third capacitive element connected between respective emitters of said first and second transistors.

6. An oscillator as set forth in claim 5, wherein said first and second capacitive elements function as positive feedback capacitors, and wherein said third capacitive element functions as a coupling capacitor.

7. An oscillator as set forth in claim 5, wherein said differential amplifier comprises a first current source connected between said emitter of said first transistor and ground, and a second current source connected between said emitter of said second transistor and ground.

8. An oscillator as set forth in claim 7, wherein said differential type amplifier comprises a voltage biasing circuit connected to said bases of said first and second transistors.

9. An oscillator as set forth in claim 5, wherein said oscillator is formed as a differential Colpitz oscillation circuit.

10. An oscillator comprising:

a differential type amplifier formed by first and second transistors;

a resonance circuit, output terminals thereof being connected to bases of said first and second transistors;

a first inductive element directly connected between said bases of said first and second transistors;

a first capacitive element connected between a base and an emitter of said first transistor;

a second capacitance element connected between said emitter of said first transistor and ground;

a third capacitive element connected between a base of said second transistor and ground; and a collector of said first transistor being connected to ground.

11. An oscillator as set forth in claim 10, wherein said first inductance element has a point where inductance thereof is divided into substantially two equal values and that is connected to ground.

12. An oscillator as set forth in claim 11, further comprising a mixing circuit having input terminals connected to output terminals of said amplifier, and a second inductive element connected between an output terminal of said mixing circuit and a frequency control terminal of said resonance circuit, wherein said resonance circuit is driven by a signal which is phase-detected in response to an output signal of said amplifier in said mixing circuit and is applied to said frequency control terminal through said second inductive element.

13. An oscillator as set forth in claim 12, wherein said resonance circuit comprises at least first and second variable capacitive elements oppositely connected in series, and wherein said frequency control terminal is provided at a point commonly connecting said variable capacitive elements, to vary the capacitances of said first and second variable capacitive elements in response to a signal from said second inductive element.

* * * * *